US006639870B2

(12) United States Patent
Sin (10) Patent No.: US 6,639,870 B2
(45) Date of Patent: Oct. 28, 2003

(54) ADDRESS TRANSITION DETECTING CIRCUIT (75) Inventor: Tae Seung Sin, Ichon-Shi (KR)

(73) Assignee: Hynix Semiconductor, Inc., Kyungki-Do (KR)

( * ) Notice: Subject to any disclaimer, the term of this patent is extended or adjusted under 35 U.S.C. 154(b) by 0 days.

(21) Appl. No.: 10/005,800

(22) Filed: Dec. 7, 2001

(65) Prior Publication Data
US 2003/0002383 A1 Jan. 2, 2003

(30) Foreign Application Priority Data
Jun. 29, 2001 (KR) .......................... 01-38416

(51) Int. Cl.[7] ............................................. G11C 8/00
(52) U.S. Cl. ................ 365/233.5; 365/233; 365/189.05
(58) Field of Search .................. 365/233.5, 189.05, 365/233

(56) References Cited

U.S. PATENT DOCUMENTS 5,295,117 A * 3/1994 Okada ................... 365/233.5
6,040,715 A * 3/2000 Kang et al. ................ 326/87
6,058,070 A * 5/2000 La Rosa ................ 365/233.5

* cited by examiner

Primary Examiner—David Nelms
Assistant Examiner—Connie C. Yoha
(74) Attorney, Agent, or Firm—Morgan, Lewis & Bockius LLP (57) ABSTRACT The present invention relates to an address transition detecting circuit. The present invention has a control means for control charge/discharge of a given portion of the address transition detecting circuit in order to remove a noise of an address transition detection signal generated by a glitch signal included in a given signal applied to an input terminal of an address transition detecting circuit and also has a noise removing circuit for removing the noise included in the address transition detection signal in the output unit of the address transition detecting circuit. Therefore, the present invention can prevent generation of an unnecessary address transition detection signal pulse upon generation of a glitch and can thus stably drives semiconductor chips even at a high power supply voltage.

17 Claims, 6 Drawing Sheets

ADDRESS TRANSITION DETECTING CIRCUIT

BACKGROUND OF THE INVENTION

1. Field of the Invention

The invention relates generally to an address transition detecting circuit. More particularly, the invention is concerned with an address transition detecting circuit capable of preventing generation of unnecessary address transition detection signal pulses when glitch is generated and thus stably driving semiconductor chips even at a high power supply voltage, by including a control means for controlling charge/discharge of a given portion of the address transition detecting circuit and a noise removing circuit for removing the address transition detection signal included in the noise at an output terminal of the address transition detecting circuit, in order to remove noises of the address transition detection signal generated by a glitch signal included in a given signal applied to an input terminal of the address transition detecting circuit.

2. Description of the Prior Art

The intensity of semiconductor memory devices becomes higher and its access speed to data becomes also higher. This results from that the processing speed of a microprocessor is further higher. The semiconductor memory devices adopt various technologies for higher operation. One of them is an address transition detecting circuit (hereinafter called "ATD").

An operation principle of the ATD will be shortly described as follows.

The ATD detects an address transition inputted outside the chip to internally generate a pulse and internal circuits are synchronized to this pulse to allow a higher operation of the chip.

Figure 1:
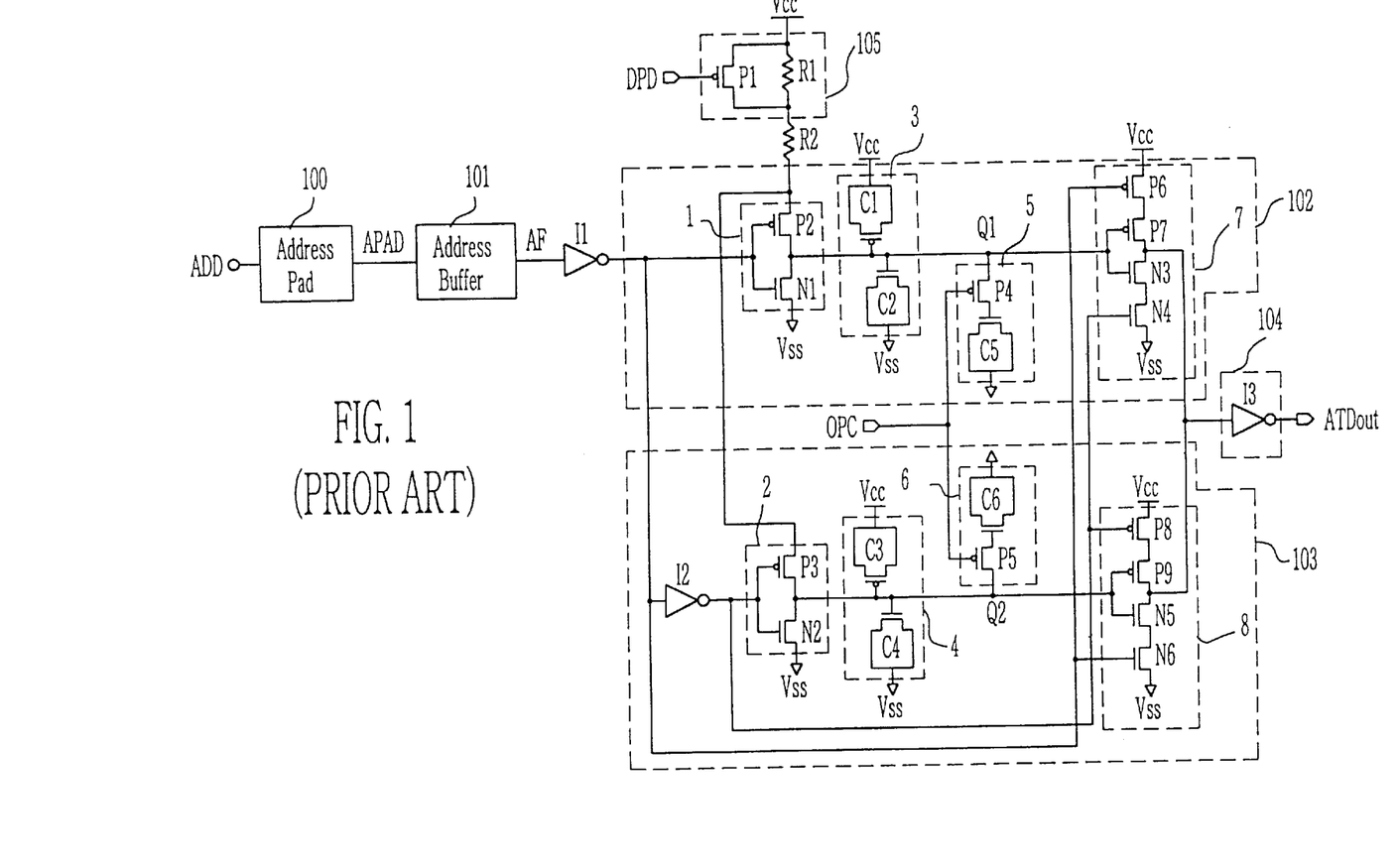
FIG. 1 is a detailed circuit diagram of a conventional ATD.

Referring now to FIG. 1, there is shown a detailed circuit diagram of a conventional ATD.

The ATD includes an address pad 100 for receiving a drain signal ADD as an input to output an address pad signal APAD, an address buffer 101 for internally buffering the address pad signal APAD through the address pad 100, a first pulse detecting unit 102 for detecting a first transition of an output signal AF of the address buffer 101, a second pulse detecting unit 103 for detecting a second transition of an output signal AF of the address buffer 101, a voltage fall unit 105 for falling the power supply voltage applied to the first pulse detecting unit 102 and the second pulse detecting unit 103 to a given voltage, and an output unit 104 for inverting the output signals of the first pulse detecting unit 102 and the second pulse detecting unit 103.

The first pulse detecting unit 102 includes a third inverting means 1 connected to an output terminal of the first inverting means I1 for inverting the address buffer signal AF, for inverting an output signal of the first inverting means I1; a first buffering means 3 connected to an output terminal of the third inverting means 1, for stabilizing an output signal of the third inverting means 1 to a given potential; a first delay means 5 connected between a first node Q1 connected to an output terminal of the third inverting means 1 and a ground terminal Vss; and a fifth inverting means 7 connected between the power supply terminal Vcc and the ground terminal Vss, for inverting the potential of the first node Q1.

Also, the second pulse detecting unit 103 includes a second inverting means I2 for inverting an output signal of the first inverting means I1; a fourth inverting means 2 for inverting an output signal of the second inverting means I2; a second buffering means 4 for stabilizing an output signal of the fourth inverting means 2 to a given potential; a second delay means 6 connected between the second node Q2 connected to an output terminal of the fourth inverting means 2 and the ground terminal Vss; and a sixth inverting means 8 connected between the power supply terminal Vcc and the ground terminal Vss, for inverting the potential of the second node Q2.

The output unit 104 includes a seventh inverting means I3 for inverting one of the output signals from the output terminal of the first pulse detecting unit 102 or the second pulse detecting unit 103 to output an address transition detection signal ATDout.

The voltage fall unit 105 includes a first PMOS transistor P1 and a first resistor R1, which are in parallel connected between the power supply terminal Vcc and the second resistor R2. The first PMOS transistor P1 is driven by the first signal DPD that is generated in an external signal generating circuit.

The third inverting means 1 includes the second PMOS transistor P2 and the first NMOS transistor N1, which are serially connected between the second resistor R2 and the ground terminal Vss. The fourth inverting means 2 includes the third PMOS transistor P3 and the second NMOS transistor N2, which are serially connected between the second resistor R2 and the ground terminal Vss.

The first buffering means 3 includes a first capacitor C1 connected between the power supply terminal Vcc and the first node Q1, and a second capacitor C2 connected between the ground terminal Vss and the first node Q1. The second buffering means 4 includes a third capacitor C3 connected between the power supply terminal Vcc and the second node Q2, and a fourth capacitor C4 connected between the ground terminal Vss and the second node Q3.

The first delay means 5 includes the fourth PMOS transistor P4 and the fifth capacitor C5, which are connected between the first node Q1 and the ground terminal Vss. The second delay means 6 includes the fifth PMOS transistor P5 and the sixth capacitor C6, which are connected between the second node Q2 and the ground terminal Vss. The fourth PMOS transistor P4 and the fifth PMOS transistor P5 are driven by a second signal OPC generated in an external signal generating circuit.

The fifth inverting means 7 includes a sixth PMOS transistor P6 connected between the power supply terminal Vcc and the ground terminal Vss and driven depending on an output signal of the first inverting means I1; a seventh PMOS transistor P7 driven by the potential of the first node Q1, for inverting the potential of the first node Q1; and a fourth NMOS transistor N4 driven depending on the output signals of the third NMOS transistor N3 and the second inverting means I2.

The sixth inverting means 8 includes an eighth PMOS transistor P8 connected between the power supply terminal Vcc and the ground terminal Vss and driven depending on an output signal of the second inverting means I2; a ninth PMOS transistor P9 and a fifth NMOS transistor N5 driven by the potential of the second node Q2, for inverting the potential of the second node Q2; and a sixth NMOS transistor N6 driven by an output signal of the first inverting means I1.

The ATD circuit constructed as mentioned above detects that the first pulse detecting unit 102 transits the output signal AF of the address buffer 101 from LOW to HIGH, and the second pulse detecting unit 103 transits the output signal AF of the address buffer 101 from HIGH to LOW.

It will be explained in conjunction with the operational timing in FIG. 4. The address signal ADD inputted to the address pad 100 pass through the address buffer 101 and then outputs the address buffer signal AF having the same phase to the address signal ADD inputted to the address pad 100 to apply it to the first pulse detecting unit 102 and the second pulse detecting unit 103.

For example, if the address signal ADD inputted to the address pad 100 is transited from a HIGH state to a LOW state during the period from "T1" time to "T2" time, the address transition detection signal ATDout the initial state of which is HIGH is transited to a LOW state and is then transited to a HIGH state during the period from "T2" time to "T3" time when the potential on the second node Q2 is transited from a LOW state to a HIGH state.

In more detail, the address buffer 101 outputs the address buffer signal AF having the same phase to the address pad signal APAD during the period from "T1" time to "T2" time. The address buffer signal AF is inverted by the first inverting means I1 and is then simultaneously inputted to the first pulse detecting unit 102 and the second pulse detecting unit 103 with a HIGH state.

The address buffer signal AF inverted to be a HIGH state is applied to the third inverting means 1 of the first pulse detecting unit 102 to turn on the first NMOS transistor N1 of the third inverting means 1 and at the time to turn off the second PMOS transistor P2. Therefore, an output signal of the third inverting means 1 is outputted with a LOW state since the potential on the first node Q1 is outputted to the ground terminal Vss via the first NMOS transistor N1.

A LOW state signal outputted on the first node Q1 is stabilized by the first buffering means 3 consisting of the first and second capacitors C1 and C2.

Meanwhile, the sixth PMOS transistor P6 of the fifth inverting means 7 using the output signal of the first inverting means I1 as an input is turned off while the sixth NMOS transistor N6 of the sixth inverting means 8 is turned on. Thereafter, the seventh PMOS transistor P7 using the output signal of the third inverting means 1 as an input is turned on while the third NMOS transistor N3 is turned off.

Also, the output signal of the second inverting means I2 using the output signal of the first inverting means I1 as an input is transited to a LOW state. The third PMOS transistor P3 of the fourth inverting means 2 using the output signal of the second inverting means I2 as an input is turned on while the second NMOS transistor N2 is turned off.

Therefore, the power supply voltage of a HIGH state applied via the voltage fall unit 105 and the second resistor R2 from the power supply terminal Vcc is supplied to the second node Q2 via the third PMOS transistor P3. The potential of a HIGH state supplied to the second node Q2 is stabilized by the second buffering means 4 and is then applied to the ninth PMOS transistor P9 and the fifth NMOS transistor N5 of the sixth inverting means 8. The fifth NMOS transistor N5 is turned on by the potential of a HIGH state while the ninth PMOS transistor P9 is turned off.

Meanwhile, the fourth NMOS transistor N4 of the second inverting means I2 using the output signal of the fifth inverting means 7 as an input is turned off while the eighth PMOS transistor P8 of the sixth inverting means 8 is turned on.

At this time, the potential on the second node Q2 starts to transit to a HIGH state from "t1" time when the potential on the first node Q1 is completely transited to a LOW state by the second inverting means I2. That is, at the moment when the potential on the second node Q2 is completely transited to a LOW state and is then applied to the seventh PMOS transistor P7 and the third NMOS transistor N3 of the fifth inverting means 7, the potential on the second node Q2 is maintained to be a LOW state and is then applied to the ninth PMOS transistor P9 and the fifth NMOS transistor N5 of the sixth inverting means 8.

At this time, the sixth PMOS transistor P6 of the fifth inverting means 7 is supplied with a HIGH state signal and is thus turned on, while the fourth NMOS transistor N4 is supplied with a LOW state signal and is thus turned of. Also, the eighth PMOS transistor P8 of the sixth inverting means 8 is supplied with a LOW state signal and is thus turned on, while the sixth NMOS transistor N6 is supplied with a High state signal and is thus turned off.

Due to this the fifth inverting means 7 is maintained to be floated during the period from "T2" time to "t1" time while the sixth inverting means 8 outputs an output signal of a HIGH state to the seventh inverting means I3 of the output unit 104. The seventh inverting means I3 of the output unit 104 inverts the output signal of a HIGH state to output the address transition detection signal ATDout of a LOW state.

Then, if the potential on the second node Q2 is raised during the period from "t1" time to "T3" time and is thus transited to a HIGH state, during this time, the ninth PMOS transistor P9 of the sixth inverting means 8 is turned off while the fifth NMOS transistor N5 is turned on. Therefore, the output signals of the ninth PMOS transistor P9 and the fifth NMOS transistor N5 are transited to a LOW state. The output unit 104 inverts the potential of a LOW state again to output the address transition detection signal ATDout of a HIGH state.

Figure 4:
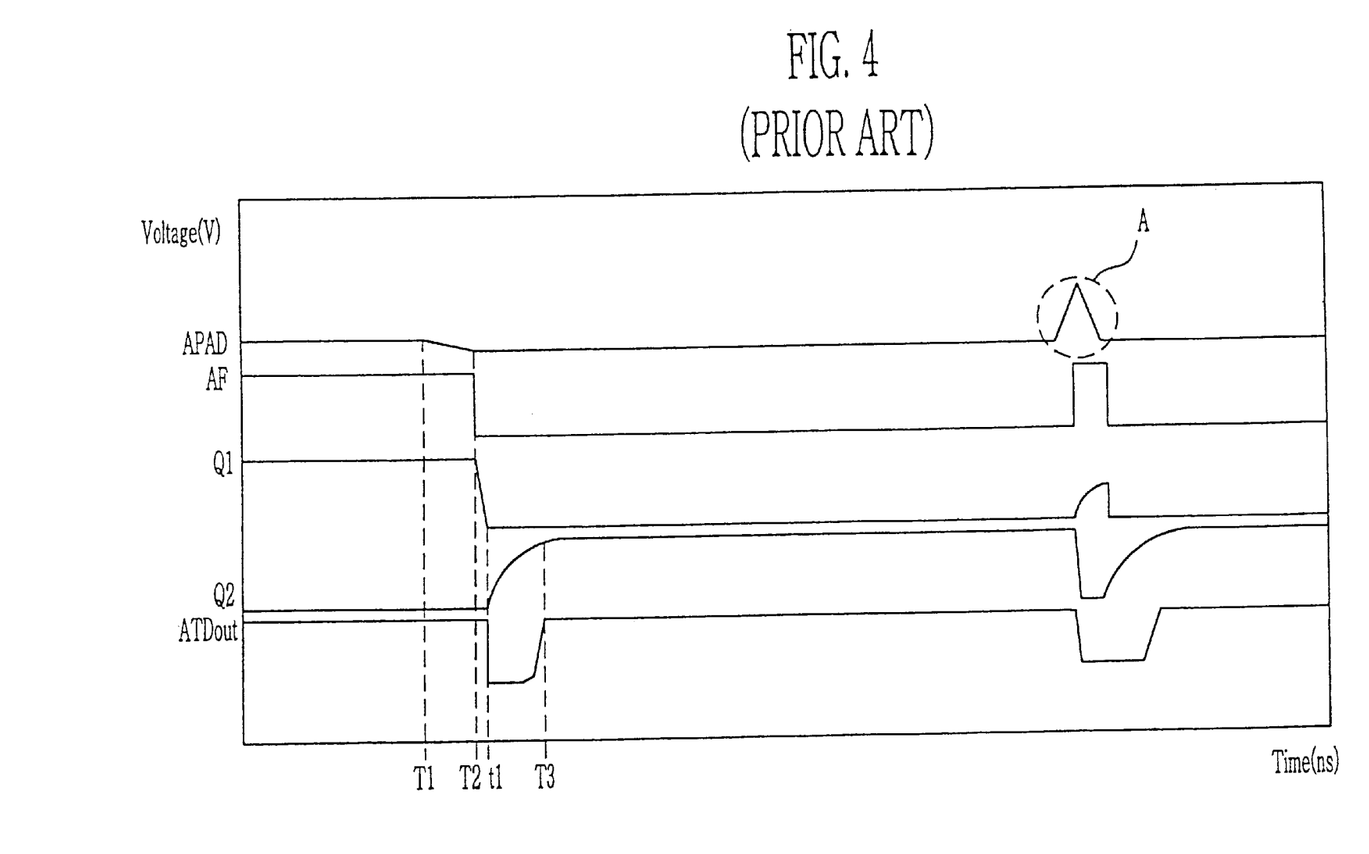
FIG. 4 is an operational characteristic diagram of the ATD shown in FIG. 1.

However, though the conventional ATD circuit as mentioned above must be driven only when an address is transited, the ATD circuit is driven at the value in which an unwanted noise or glitch such as "A" shown in FIG. 4 is included, that is, even at a HIGH state or a LOW state. Therefore, there is a problem that abnormal address transition detection signal ATDout is generated.

SUMMARY OF THE INVENTION

It is therefore an object of the present invention to provide an address transition detecting circuit capable of preventing generation of unnecessary address transition detection signal by means of a glitch of an address signal.

In order to accomplish the above object, an address transition detecting circuit according to the present invention is characterized in that it comprises a first detecting means for detecting a first transition of an address buffer signal, by which an external address signal is buffered/outputted; a first control means for controlling the flow of current of the first detecting means so that the output of the first detecting means has a different phase from and the same pulse width to the address buffer signal; a second detecting means for detecting a second transition of the address buffer signal; a second control means for controlling the flow of current of the second detecting means so that the output of the second detecting means has a different phase from and the same pulse width to the address buffer signal; and an output means for inverting the output of the first detecting means or the output of the second detecting means to output an address transition detecting signal.

Also, an address transition detecting circuit according to the present invention is characterized in that it comprises a first detecting means for detecting a first transition of an address buffer signal, by which an external address signal is buffered/outputted; a first control means for controlling the flow of current of the first detecting means so that the output of the first detecting means has a different phase from and the same pulse width to the address buffer signal; a second detecting means for detecting a second transition of the address buffer signal; a second control means for controlling the flow of current of the second detecting means so that the output of the second detecting means has a different phase from and the same pulse width to the address buffer signal; a first output means for inverting the output of the first detecting means or the output of the second detecting means to output a first address transition detecting signal; a noise removing means for removing a noise included in the first address transition detecting signal; and a second output means for inverting the output of the noise removing means to output a second address transition detecting signal.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

The present invention will be described in detail by way of a preferred embodiment with reference to accompanying drawings, in which like reference numerals are used to identify the same or similar parts.

Figure 2A:
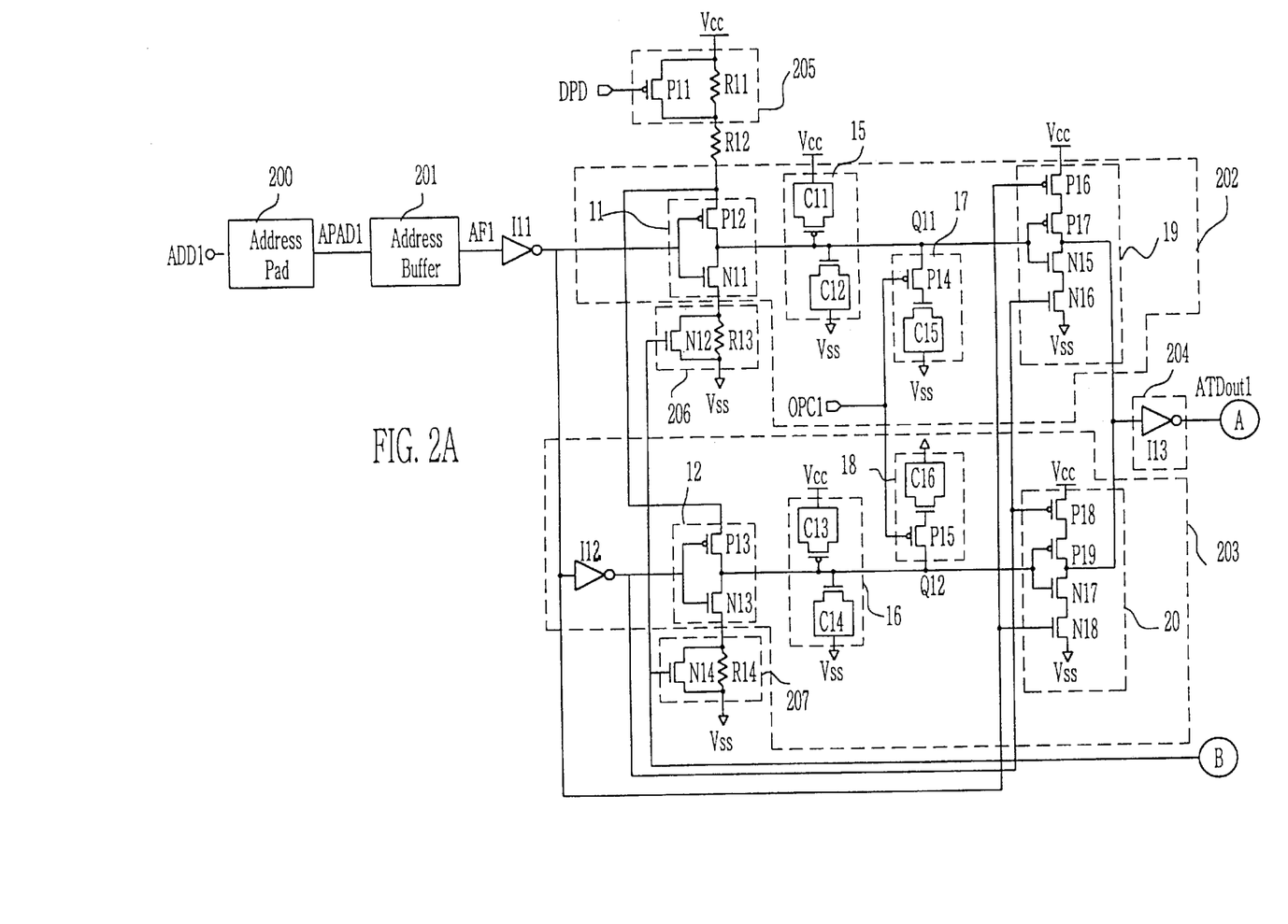
FIGS. 2A and 2B are detailed circuit diagram of an ATD according to one embodiment of the present invention.
Figure 2B:
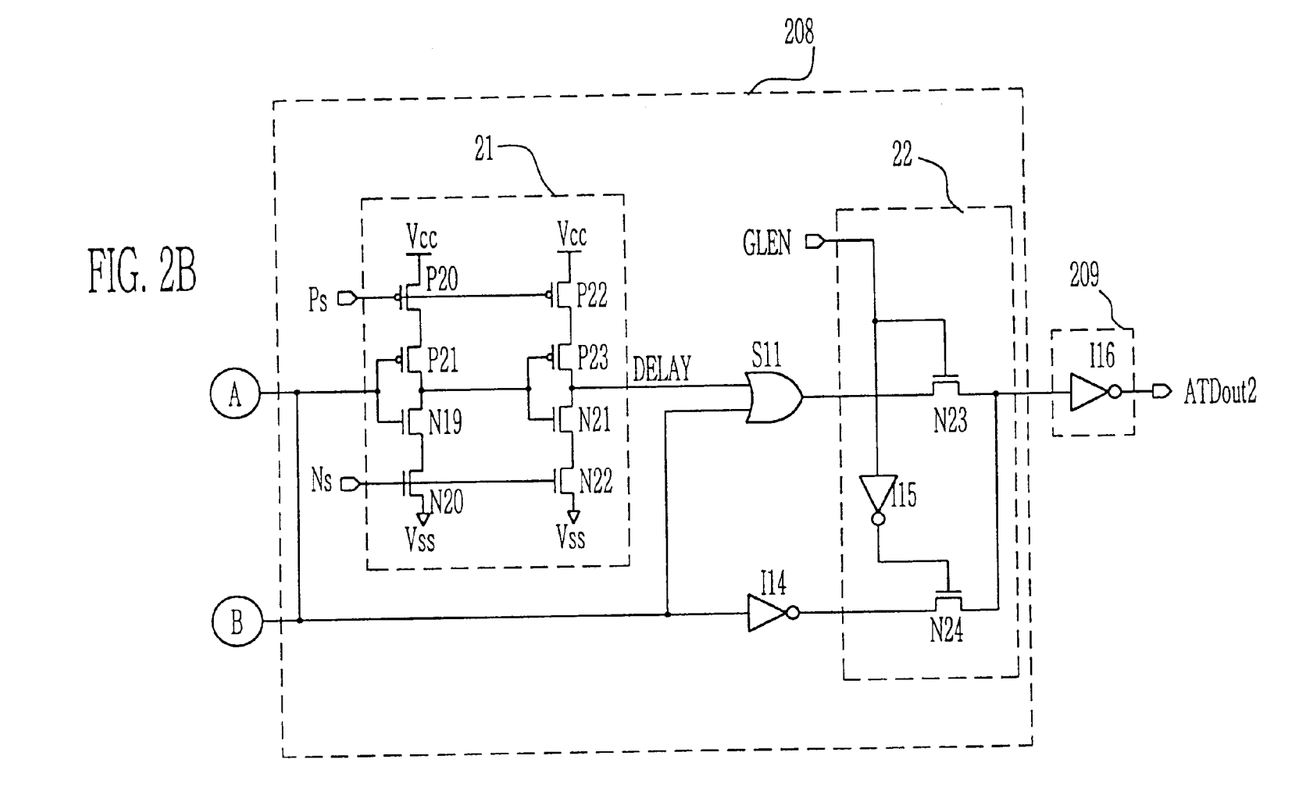

FIGS. 2A and 2B are detailed circuit diagram of an ATD according to one embodiment of the present invention.

Referring now to FIGS. 2A and 2B, the circuit includes an address pad 200 for receiving an address signal ADD1 from the outside as an input to output an address pad signal APAD1; an address buffer 201 for internally buffering the address pad signal APAD1 from the address pad 200; a first pulse detecting unit 202 for detecting a first transition of an output signal AF1 of the address buffer 201; a second pulse detecting unit 203 for detecting a second transition of the output signal AF1 of the address buffer 201; a voltage fall unit 205 for falling the power supply voltage applied to the first pulse detecting unit 202 and the second pulse detecting unit 203; a first output unit 204 for inverting the output signals of the first pulse detecting unit 202 and the second pulse detecting unit 203; a first control means 206 for controlling the output of the first pulse detecting unit 202 depending on the first address transition detection signal ATDout1 outputted from the first output unit 204; a second control means 207 driven by the first address transition detection signal ATDout1 for controlling the output of the second pulse detecting unit 203; a noise removing circuit unit 208 for delaying the first address transition detection signal ATDout1 by a given time to remove noise included in the first address transition detection signal ATDout1; and a second output unit 209 for inverting the output signal of the noise removing circuit unit 208 to output an second address transition detection signal ATDout2.

The first pulse detecting unit 202 includes a third inverting means 11 connected to the first inverting means I11 for inverting the address buffer signal AF1, for inverting the output signal of the first inverting means I11; a first buffering means 15 connected to the output terminal of the third inverting means 11, for stabilizing the inverted signal with a given potential to the third inverting means 11; a first delay means 17 connected between a first node Q11 and a ground terminal Vss; and a fifth inverting means 19 connected between the power supply terminal Vcc and the ground terminal Vss.

Also, the second pulse detecting unit 203 includes a second inverting means I12 for inverting the output signal of the first inverting means I11; a forth inverting means 12 for inverting the output signal of the second inverting means I12; a second buffering means 16 for stabilizing the output signal of the forth inverting means 12 to a given potential; a second delay means 18 connected between the second node Q12 and the ground terminal Vss; and a sixth inverting means 20 connected between the power supply terminal Vcc and the ground terminal Vss.

The first output unit 204 consists of a seventh inverting means I13 for inverting one of the output signals outputted to the output terminal of the first pulse detecting unit 202 or the second pulse detecting unit 203 to output the first address transition detection signal ATDout1.

The voltage fall unit 205 includes a first PMOS transistor P11 and a first resistor R11, which are in parallel between the power supply terminal Vcc and the second resistor R12. The first PMOS transistor P11 is driven by the first signal DPD1 that is generated by an external signal generating circuit.

The first control means 206 includes a second NMOS transistor N12 connected between the third inverting means 11 and the ground terminal Vss and driven depending on the first address transition detection signal ATDout1; and a third resistor R13 in parallel connected to the second NMOS transistor N12. The first control means 206 control charge/discharge on the first node Q11 depending on the first address transition detection signal ATDout1.

The second control means 207 includes a fourth NMOS transistor N14 connected between the fourth inverting means 12 and the ground terminal Vss depending on the first address transition detection signal ATDout1, and a fourth resistor R14 in parallel connected to the fourth NMOS transistor N14. The second control means 207 controls charge/discharge on the second node Q12 depending on the first address transition detection signal ATDout1.

The third inverting means 11 includes a second PMOS transistor P12 and a first NMOS transistor N11, which are serially connected between the second resistor R12 and the first control means 206. The fourth inverting means 12 includes a third PMOS transistor P13 and a third NMOS transistor N13, which are serially connected between the second resistor R12 and the second control means 207.

The first buffering means 15 includes a first capacitor C11 connected between the power supply terminal Vcc and the first node Q11, and a second capacitor C12 connected between the ground terminal Vss and the first node Q11. The second buffering means 16 includes a third capacitor C13 connected between the power supply terminal Vcc and the second node Q12, and a fourth capacitor C14 connected between the ground terminal Vss and the second node Q12.

The first delay means 17 includes a fourth PMOS transistor P14 and a fifth capacitor C15, which are connected between the first node Q11 and the ground terminal Vss. The second delay means 18 includes a fifth PMOS transistor P15 and a sixth capacitor C16, which are connected between the second node Q12 and the ground terminal Vss. The fourth PMOS transistor P14 and the fifth PMOS transistor P15 are driven by the first signal OPC1 generated in the external signal generating circuit.

The fifth inverting means 19 includes a sixth PMOS transistor P16 connected between the power supply terminal Vcc and the ground terminal Vss and driven by the output signal of the first inverting means I11, a seventh PMOS transistor P17 and a fifth NMOS transistor N15 driven by the potential of the-first node Q11 to invert the potential of the first node Q11, and a sixth NMOS transistor N16 driven by the output signal of the second inverting means I12.

The sixth inverting means 20 includes an eighth PMOS transistor P18 connected between the power supply terminal Vcc and the ground terminal Vss and driven by the output signal of the second inverting means I12, a ninth PMOS transistor P19 and a seventh NMOS transistor N17, which are driven by the potential of the second node Q12 for inverting the potential of the second node Q12, and an eighth NMOS transistor N18 driven by the output signal of the first inverting means I11.

The noise removing circuit unit 208 includes a third buffering means 21 for delaying/stabilizing the first address transition detection signal ATDout1 outputted from the first output unit 204 by a given period of time; an OR gate S11 for ORing the output signal DELAY of the third buffering means 21 and the first address transition detection signal ATDout1; an eighth inverting means I14 for inverting the first address detection signal ATDout1; and a transfer means 22 for transmitting the output signal from the OR gate S11 or the output signal from the eighth inverting means I14 to the second output unit 209, depending on a glen signal GLEN generated by the external signal generating circuit.

The third buffering means 21 includes a tenth PMOS transistor P20 and a twelfth PMOS transistor P22, which are connected between the power supply terminal Vcc and the ground terminal Vss, depending on a second signal Ps generated by the external bias circuit; an eleventh PMOS transistor P21 and a ninth NMOS transistor N19 driven by the first address transition detection signal ATDout1 for inverting the first address transition detection signal ATDout1; a thirteenth PMOS transistor P23 and an eleventh NMOS transistor N21 for inverting the output signals of the eleventh PMOS transistor P21 and the ninth NMOS transistor N19; and a tenth NMOS transistor N20 and a twelfth NMOS transistor N22 driven by a third signal Ns generated by the external signal generating circuit.

The transfer means 22 includes a thirteenth NMOS transistor N23 connected between the OR gate S11 and the tenth inverting means I16 and driven by the fourth signal GLEN, for inverting the output signal of the OR gate S11; a ninth inverting means I15 for inverting the fourth signal GLEN; and a fourteenth NMOS transistor N24 driven by the output signal of the ninth inverting means I15, for transmitting the output signal of the eighth inverting means I14 to the second output unit 209.

Figure 3:
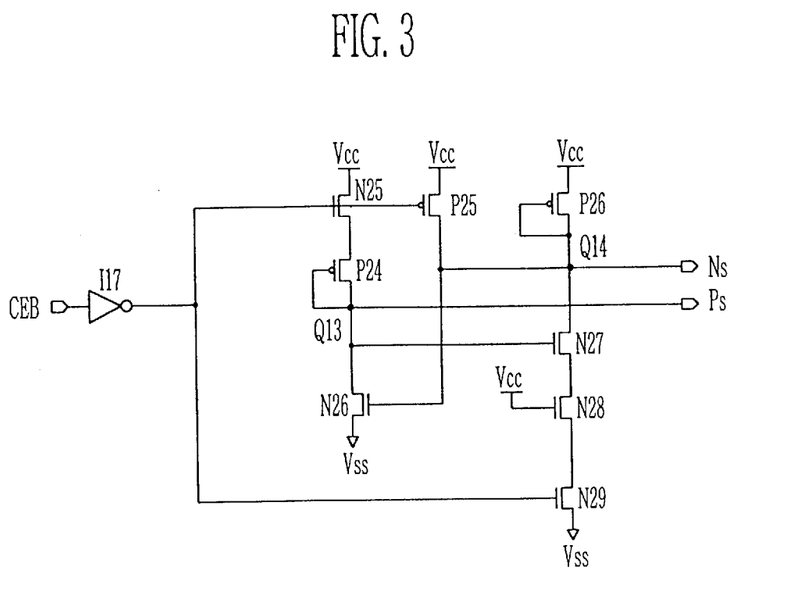
FIG. 3 is a detailed circuit diagram of a bias circuit for driving a noise removing circuit unit shown in FIG. 2B.

The mentioned second and the third signals Ps and Ns may be implemented for example using the bias circuit shown in FIG. 3. That is, the bias circuit includes an eleventh inverting means I17 for inverting a fifth signal CEB generated by the external signal generating circuit; a fifteenth NMOS transistor N25 connected between the power supply terminal Vcc and the third node Q13 and driven by the output signal of the eleventh inverting means I17; a fourteenth PMOS transistor P24 driven by the potential of the third node Q13; a sixteenth NMOS transistor N26 connected between the third node Q13 and the ground terminal Vss and driven by the potential of the fourth node Q14; a fifteenth PMOS transistor P25 connected between the power-supply terminal Vcc and the fourth node Q14 and driven depending on the output signal of the first inverting means I17; a sixteenth PMOS transistor P26 connected between the power supply terminal Vcc and the fourth node Q14 and driven depending on the potential of the fourth node Q14; a seventeenth NMOS transistor N27 connected between the fourth node Q14 and the ground terminal Vss and driven by the potential of the third node Q13; an eighteenth NMOS transistor N28 driven by the power supply voltage Vcc; and a ninth NMOS transistor N29 driven by the output signal of the eleventh inverting means I17.

The driving characteristic of the mentioned ATD will be now described in connection with the operational timing shown in FIG. 5. At this time, in case of an ideal address pad signal APAD1, the driving characteristic of the ATD during the period from "T11" time to "T12" time will be omitted because it is same to the operational timing shown in FIG. 4. The driving characteristic of the ATD only in the case that a glitch is generated in the address pad signal APAD1 such as "B" shown in FIG. 3 will be described.

Figure 5:
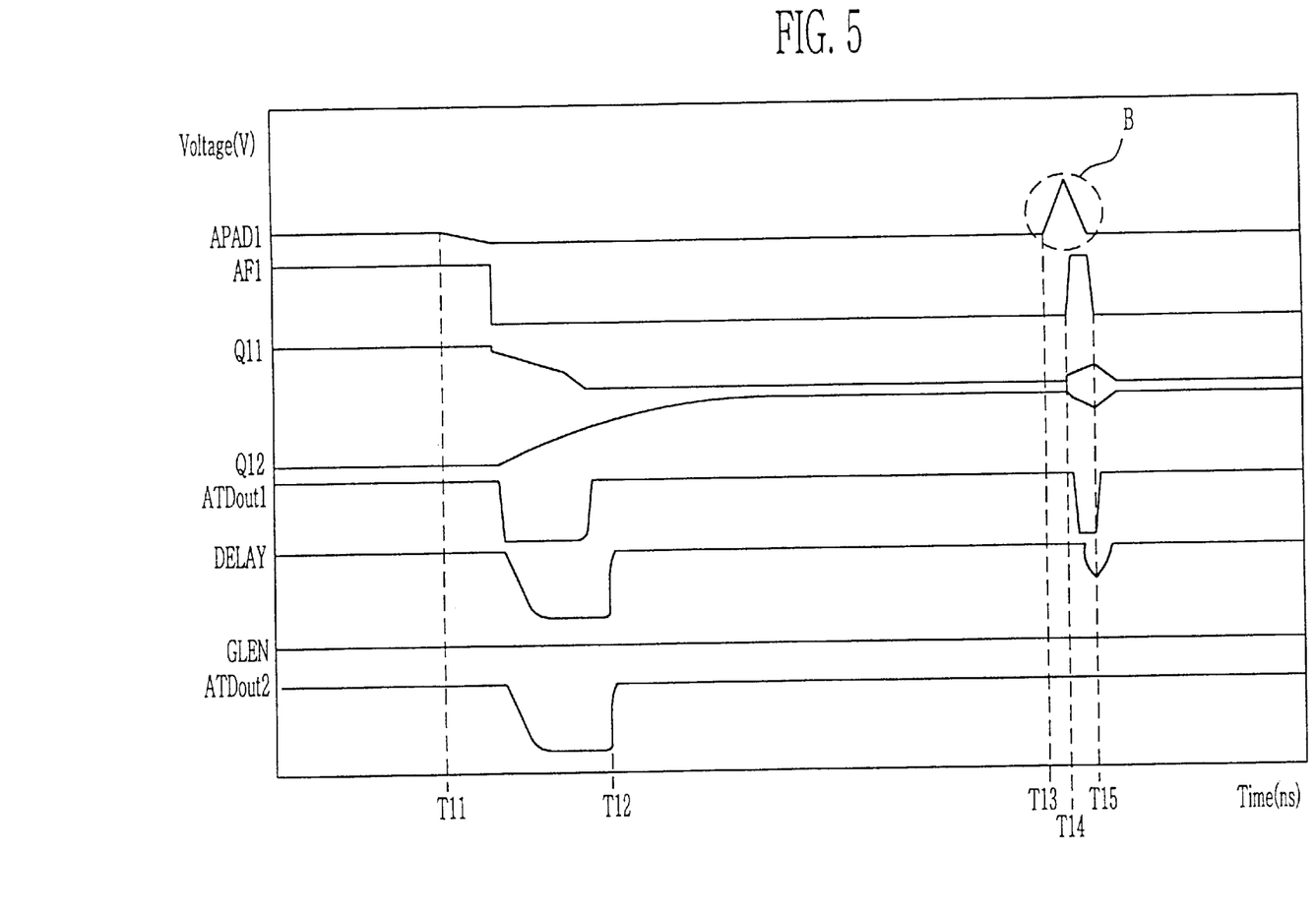
FIG. 5 is an operational characteristic diagram of the ATD shown in FIGS. 2A and 2B.

Referring now to FIG. 5, a given glitch outputted from the address pad 200 passes through the address buffer 201 as shown in "B". Then, address buffer signal AF1, which is same in the phase to the glitch signal outputted from the address pad 200, is outputted to the first pulse detecting unit 202 and the second pulse detecting unit 203.

For example, in case that a given glitch signal outputted from the address pad 200 is inputted to the address buffer 201 from a LOW state to a HIGH state in a saw-toothed shape during the period form "T13" time to "T14"-time, the address buffer 201 outputs an address buffer signal AF1 from a LOW state to a HIGH state having a rectangular wave at the time when the glitch signal reaches the highest point ("T14" time). Also, the address buffer signal AF1 is inverted by the first inverting means I11 and is then simultaneously inputted to the first pulse detecting unit 202 and the second pulse detecting unit 203 with a LOW state.

Explaining in more detail, at the "T14" time, the address buffer 201 outputs the address buffer signal AF1 of a rectangular wave having the same phase to the address pad signal APAD1. The address buffer signal AF1 is inverted by the first inverting means I11 and is then simultaneously inputted to the first pulse detecting unit 202 and the second pulse detecting unit 203 with a HIGH state.

The address buffer signal AF1 inverted into a LOW state is applied to the third inverting means 11 of the first pulse detecting unit 202 to turn on the second PMOS transistor P12 of the third inverting means 11 and to turn off the first NMOS transistor N11.

Therefore, the power supply voltage is applied to the first node Q11 via the voltage fall unit 205, the second resistor R12 and the second PMOS transistor P12 so that the output of the third inverting means 11 is outputted with a HIGH state.

Meanwhile, at the "T14" time, the output signal of the second inverting means I12 using the output signal of the first inverting means I11 as an input is transited into a HIGH state. The third PMOS transistor P13 of the fourth inverting means 12 using the output signal of the second inverting means I12 as an input is turned off while the third NMOS transistor N13 is turned on.

Also, the fourth NMOS transistor N14 of the second control means 207, that is transited to a LOW state, for receiving the first address transition detection signal ATDout1 as an input is turned off. Therefore, the second control means 207 is driven by a resistor device having a given resistance value by the fourth resistor R14, so that the potential on the second node Q12 is discharged into the ground terminal Vss via the fourth resistor R14. That is, the potential charged with a HIGH state on the second node Q12 is discharged into the ground terminal Vss via the first control means 13 and is slowly transited with a LOW state by the second buffering means 16 and the second delay means 18.

Thereafter, at the "T15" time, if the address pad signal APAD1 is transited from a HIGH state to a LOW state, the address buffer 201 outputs the address buffer signal AF1 of a rectangular wave, which has the same phase to the address pad signal APAD1. The address buffer signal AF1 is inverted by the first inverting means I11 and is then simultaneously inputted to the first pulse detecting unit 202 and the second pulse detecting unit 203 with a HIGH state.

Also, the second PMOS transistor P12 of the third inverting means 11 in the first pulse detecting unit 202 using the address buffer signal AF1 inverted into a HIGH state as an input is turned off while the first NMOS transistor N11 is turned on. Therefore, the potential on the first node Q11 is discharged to the ground terminal Vss via the first NMOS transistor N11 and the third resistor R13, so that the output of the third inverting means 11 starts to transit to a logic LOW state.

Then, the potential on the first node Q1 is stabilized by the first buffering means 15 and is then applied to the third inverting means 19.

Also, the sixth PMOS transistor P16 of the fifth inverting means 19 is turned off by the output signal of the first inverting means I11 while the sixth NMOS transistor N16 is turned off by the output signal of the second inverting means I12. Thus, the third inverting means 19 is floated without regard to the potential on the first node Q11 inputted to the seventh PMOS transistor P17 and the fifth NMOS transistor N15 in the fifth inverting means 19.

Meanwhile, at the "T15" time, the output signal of the second inverting means I12 using the output signal of the first inverting means I11 as an input is transited to a LOW state. The third PMOS transistor P13 of the fourth inverting means 12 using the output signal of the second inverting means I12 as an input is turned on while the third NMOS transistor N13 is turned off. Therefore, the power supply voltage Vcc is applied to the second node Q12 via the voltage fall unit 205, the second resistor R12 and the third PMOS transistor P13, so that the output signal of the fourth inverting means 12 is outputted as a HIGH state.

Also, the eighth PMOS transistor P18 of the sixth inverting means 20 is turned on by the output signal of the second inverting means I12 while the eighth NMOS transistor N18 is turned off by the output signal of the first inverting means I11. Further, during the time when the second node Q12 is transited to a HIGH state, the seventh NMOS transistor N17 of the sixth inverting means 20 is turned on while the ninth PMOS transistor P19 is turned off. Therefore, the potential of the output node of the sixth inverting means 20 is discharged into the ground terminal Vss via the seventh NMOS transistor N17 and the eighth NMOS transistor N18, so that the output signal of the sixth inverting means 20 is outputted as a LOW state.

The seventh inverting means I13 of the first output unit 204 inverts the output signal of a LOW state to output the first address transition detection signal ATDout1 of a HIGH state.

Along with it, the first address transition detection signal ATDout1 outputted with a HIGH state as above is supplied to the third buffering means 21 of the noise removing circuit 208. Thereafter, the first address transition detection signal ATDout1 is delayed by the third buffering means 21 that is controlled by the second and third signal Ns and Ps generated by a given bias circuit, thus producing a delay signal DELAY of a LOW state.

The delay signal DELAY is inputted to the OR gate S11 along with the first address transition detection signal ATDout1. Then, the delay signal DELAY and the address transition detection signal ATDout1 are simultaneously logically combined to be supplied to the transfer means 22 with a LOW state. The thirteenth NMOS transistor N23 of the transfer means 22 is turned on by a given fourth signal GLEN of a HIGH state while the fourteenth NMOS transistor N24 is turned off.

Therefore, the output signal of the OR gate S11 is supplied to the tenth inverting means I16 of the second output unit 207 via the thirteenth NMOS transistor N23, so that the transfer means 22 produces an output signal of a LOW state. The tenth inverting means 16 again inverts the output signal of the transfer means 22 to output the second address transition detection signal ATDout2 of a HIGH state.

Therefore, in case that the address buffer signal AF1 having a given noise transiting from a LOW state to a HIGH is supplied to the input terminal of the address transition detecting circuit so that the second node Q12 starts to transit to a LOW state, the address transition detecting circuit according to the present invention controls the potential on the second node Q12 not to be completely transited to a LOW state, using a control means constructed at a given portion of the address transition detecting circuit.

Thereafter, in case that the address buffer signal AF1 is transited from a HIGH state to a LOW state, the address transition detecting circuit generates the pulse width of the first address transition detection signal ATDout1 same to that of the address buffer signal AF1 by allowing the potential on the second node Q12 to be recognized as a HIGH state.

Further, the first address transition detection signal ATDout1, that is limited to the same size to the pulse width of the address buffer signal AF1 is connected to the first output unit of the address transition detecting circuit and is removed by the noise removing circuit driven by a given delay circuit.

As mentioned above, the present invention has a control means for control charge/discharge of a given portion of the address transition detecting circuit in order to remove a noise of an address transition detection signal generated by a glitch signal included in a given signal applied to an input terminal of an address transition detecting circuit and also has a noise removing circuit for removing the noise included in the address transition detection signal in the output unit of the address transition detecting circuit. Therefore, the present invention can prevent generation of an unnecessary address transition detection signal pulse upon generation of a glitch and can thus stably drives semiconductor chips even at a high power supply voltage.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed are:

1. An address transition detecting circuit, comprising:
   a first detecting means for detecting a first transition of an address buffer signal and outputting an external address signal having a first phase and a first pulse width;
   a first control means for controlling a flow of current of the first detecting means so that the output of the first detecting means has a second phase different from the first phase and a second pulse width equal to the first pulse width;
   a second detecting means for detecting a second transition of the address buffer signal;
   a second control means for controlling a flow of current of the second detecting means so that an output of the second detecting means has a third phase different from the first phase and a third pulse width equal to the first pulse width; and
   an output means for inverting one of the output of the first detecting means and the output of the second detecting means to output an address transition detecting signal.

2. The circuit according to claim 1, wherein the first detecting means includes:
   a second inverting means connected to a first inverting means for inverting the address buffer signal, and for inverting an output of the first inverting means;
   a first buffering means for stabilizing an output of the second inverting means to a first potential;
   a first delay means for delaying the output of the second inverting means by a first time period; and
   a third inverting means for inverting the output of the second inverting means.

3. The circuit according to claim 1, wherein the second detecting means includes:
   a fourth inverting means for inverting an output of the first inverting means;
   a fifth inverting means for inverting an output of the fourth inverting means;
   a second buffering means for stabilizing an output of the fifth inverting means;
   a second delay means for delaying the output of the fifth inverting means by a first time period; and
   a sixth inverting means for inverting the output of the fifth inverting means.

4. The circuit according to claim 1, wherein the first control means includes a first NMOS transistor, driven by the address transition detecting signal, connected between a second inverting means and a ground terminal, and a first resistor connected in parallel to the first NMOS transistor.

5. The circuit according to claim 1, wherein the second control means includes a second NMOS transistor, driven by the address transition detecting signal, connected between a fifth inverting means and a ground terminal, and a second resistor connected in parallel to the second NMOS transistor.

6. The circuit according to claim 2, wherein the third inverting means includes:
   a first PMOS transistor, driven by the output of the first inverting means, connected between a power supply terminal and a ground terminal;
   a second PMOS transistor and a third NMOS transistor, each driven by the output of the second inverting means; and
   a fourth NMOS transistor driven by an output of a fourth inverting means.

7. The circuit according to claim 3, wherein the sixth inverting means includes:
   a third PMOS transistor, driven by an output of the fourth inverting means, connected between a power supply terminal and a ground terminal;
   a fourth PMOS transistor and a fifth NMOS transistor driven by the output of the fifth inverting means; and
   a sixth NMOS transistor driven by the output of the first inverting means.

8. An address transition detecting circuit, comprising:
   a first detecting means for detecting a first transition of an address buffer signal and outputting an external address signal having a first phase and a first pulse width;
   a first control means for controlling a flow of current of the first detecting means so that the output of the first detecting means has a second phase different from the first phase and a second pulse width equal to the first pulse width;
   a second detecting means for detecting a second transition of the address buffer signal;
   a second control means for controlling a flow of current of the second detecting means so that an output of the second detecting means has a third phase different from the first phase and a third pulse width equal to the first pulse width;
   a first output means for inverting one of the output of the first detecting means and the output of the second detecting means to output a first address transition detecting signal;
   a noise removing means for removing a noise included in the first address transition detecting signal; and
   a second output means for inverting an output of the noise removing means to output a second address transition detecting signal.

9. The circuit according to claim 8, wherein the first detecting means includes:
   a second inverting means connected to a first inverting means for inverting the address buffer signal, and for inverting an output of the first inverting means;
   a first buffering means for stabilizing an output of the second inverting means to a first potential;
   a first delay means for delaying the output of the second inverting means by a first time period; and
   a third inverting means for inverting the output of the second inverting means.

10. The circuit according to claim 8, wherein the second detecting means includes:
    a fourth inverting means for inverting an output of the first inverting means;
    a fifth inverting means for inverting an output of the fourth inverting means;
    a second buffering means for stabilizing an output of the fifth inverting means;
    a second delay means for delaying the output of the fifth inverting means by a first time period; and
    a sixth inverting means for inverting the output of the fifth inverting means.

11. The circuit according to claim 8, wherein the first control means includes a first NMOS transistor, driven by the first address transition detecting signal, connected between the second inverting means and a ground terminal, and a first resistor connected in parallel to the first NMOS transistor.

12. The address transition detecting circuit according to claim 10, wherein the second control means includes a second NMOS transistor, driven by the first address transition detecting signal, connected between a fifth inverting means and a ground terminal, and a second resistor connected in parallel to the second NMOS transistor.

13. The circuit according to claim 9, wherein the third inverting means includes:
   a first PMOS transistor, driven by the output of the first inverting means, connected between a power supply terminal and a ground terminal;
   a second PMOS transistor and a third NMOS transistor, each driven by the output of the second inverting means; and
   a fourth NMOS transistor driven by an output of a fourth inverting means.

14. The circuit according to claim 10, wherein the sixth inverting means includes:
   a third PMOS transistor, driven by the output of the fourth inverting means, connected between a power supply terminal and a ground terminal;
   a fourth PMOS transistor and a fifth NMOS transistor, each driven by the output of the fifth inverting means; and
   a sixth NMOS transistor driven by the output of the first inverting means.

15. The circuit according to claim 8, wherein the noise removing means includes:
   a third buffering means for receiving first and second bias signals generated by a first bias circuit as an input to stabilize the address transition detecting signal;
   an OR gate for logically combining the output of the third buffering means and the first address transition detecting signal;
   a seventh inverting means for inverting the first address transition detecting signal; and
   a transfer means for transmitting one of an output of the OR gate and an output of a seventh inverting means to the second output means.

16. The circuit according to claim 15, wherein the third buffering means includes:
   a fifth PMOS transistor and a sixth PMOS transistor connected between a power supply terminal and a ground terminal, each driven by the first bias signal;
   a seventh PMOS transistor and a seventh NMOS transistor, each driven by the first address transition detecting signal;
   an eighth PMOS transistor and an eighth NMOS transistor, each driven by outputs of the seventh PMOS transistor and the seventh NMOS transistor; and
   a ninth NMOS transistor and a ninth NMOS transistor, each driven by the second bias signal.

17. The circuit according to claim 15, wherein the transfer means includes:
   an eleventh NMOS transistor driven by a third bias signal, for transferring the output of the OR gate to the second output means;
   an eighth inverting means for inverting the third bias signal; and
   a twelfth NMOS transistor driven by an output of the eighth inverting means, for transferring the output of the seventh inverting means to the second output means.

* * * * *